(12) United States Patent
Wang

(10) Patent No.: US 11,233,054 B2
(45) Date of Patent: Jan. 25, 2022

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Nan Wang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 66 days.

(21) Appl. No.: 16/750,155

(22) Filed: Jan. 23, 2020

(65) Prior Publication Data

US 2020/0279848 A1 Sep. 3, 2020

(30) Foreign Application Priority Data

Feb. 28, 2019 (CN) .......................... 201910153800.X

(51) Int. Cl.
*H01L 27/092* (2006.01)
*H01L 21/8238* (2006.01)
*H01L 29/16* (2006.01)

(52) U.S. Cl.
CPC .. *H01L 27/0924* (2013.01); *H01L 21/823821* (2013.01); *H01L 21/823878* (2013.01); *H01L 29/16* (2013.01)

(58) Field of Classification Search
CPC ......... H01L 27/0924; H01L 21/823878; H01L 29/16; H01L 21/823821; H01L 29/41791; H01L 21/823814; H01L 21/823871; H01L 27/0886; H01L 21/823431; H01L 21/823475

See application file for complete search history.

(56) References Cited

U.S. PATENT DOCUMENTS

2016/0163819 A1* 6/2016 Liou ............... H01L 21/823431
257/288
2017/0148797 A1* 5/2017 Kim .................... H01L 27/1104

* cited by examiner

*Primary Examiner* — Karen Kusumakar
*Assistant Examiner* — Adam S Bowen
(74) *Attorney, Agent, or Firm* — Anova Law Group, PLLC

(57) ABSTRACT

A semiconductor structure and a method for forming the semiconductor structure are provided. The semiconductor structure includes a substrate, which includes a first region, a second region, and a third region. The semiconductor structure also includes a first fin, a second fin, and a third fin formed on the first, second, and third regions, respectively. Moreover, the semiconductor structure includes an isolation layer formed on the substrate, and a portion of sidewall surface of each of the first, second, and third fins. In addition, the semiconductor structure includes a first epitaxial layer, a second epitaxial layer, and a third epitaxial layer formed on the first, second, and third fins, respectively. Two sides of the third epitaxial layer are in contact with the first epitaxial layer and the second epitaxial layer, respectively. Further, the semiconductor structure includes a conductive structure formed on the first, second, and third epitaxial layers.

20 Claims, 7 Drawing Sheets

SEMICONDUCTOR STRUCTURE AND FABRICATION METHOD THEREOF

CROSS-REFERENCES TO RELATED APPLICATIONS

This application claims the priority of Chinese patent application No. 201910153800.X, filed on Feb. 28, 2019, the entirety of which is incorporated herein by reference.

FIELD OF THE DISCLOSURE

The present disclosure generally relates to the field of semiconductor manufacturing and, more particularly, relates to a semiconductor structure and fabrication method thereof.

BACKGROUND

In the field of semiconductor technology, transistors as the most basic semiconductor devices are currently being widely used. A fin field effect transistor (FinFET) is a new complementary metal-oxide-semiconductor (CMOS) transistor. The FinFET improves circuit control, reduces leakage current, shortens a gate length of the transistor, greatly increases processing speed of a chip, and significantly reduces power consumption. Therefore, the FinFET can be applied to circuits of various semiconductor devices, e.g., a CMOS inverter circuit, and any other suitable circuit.

Because the manufacturing of integrated circuits is developed towards ultra-large scale integrated circuit, circuit density in the integrated circuit keeps increasing, and the number of components included in the chip keeps increasing. A multi-layer metal wire design using a multi-layer connection in which a plurality of insulating layers and conductive layers are superposed on each other desires to be used to electrically connect each component and to realize a desired function. Therefore, a large number of conductive structures desire to be formed.

A process for forming a conventional FinFET is used as an example. Conductive structures desire to be formed on a source region, a drain region, and a gate, to realize the multi-layer metal wire interconnection of the FinFET in the integrated circuit.

However, the performance of a semiconductor structure formed by the conventional FinFET is poor and still needs to be improved. The disclosed methods and device structures are directed to solve one or more problems set forth above and other problems.

BRIEF SUMMARY OF THE DISCLOSURE

One aspect of the present disclosure includes a semiconductor structure. The semiconductor structure includes a substrate. The substrate includes a first region, a second region, and a third region. The first region and the second region are disposed on both sides of the third region, and two sides of the third region are adjacent to the first region and the second region, respectively. The semiconductor structure also includes a first fin formed on the first region, a second fin formed on the second region, and a third fin formed on the third region. The first fin, the second fin, and the third fin are parallel to each other. Moreover, the semiconductor structure includes an isolation layer formed on the substrate, a portion of sidewall surface of the first fin, a portion of sidewall surface of the second fin, and a portion of sidewall surface of the third fin. A surface of the isolation layer is lower than top surfaces of the first fin, the second fin and the third fin. In addition, the semiconductor structure includes a first epitaxial layer formed on the first fin, a second epitaxial layer formed on the second fin, and a third epitaxial layer formed on the third fin. Two sides of the third epitaxial layer are in contact with the first epitaxial layer and the second epitaxial layer, respectively. Further, the semiconductor structure includes a conductive structure formed on the first epitaxial layer, the second epitaxial layer, and the third epitaxial layer.

Another aspect of the present disclosure includes a method for forming a semiconductor structure. The method includes providing a substrate including a first region, a second region, and a third region. The first region and the second region are disposed on both sides of the third region, and two sides of the third region are adjacent to the first region and the second region, respectively. The method also includes forming a first fin, a second fin, and a third fin on the first region, the second region, and the third region, respectively. The first fin, the second fin, and the third fin are parallel to each other. In addition, the method includes forming an isolation layer on the substrate, a portion of sidewall surface of the first fin, a portion of sidewall surface of the second fin, and a portion of sidewall surface of the third fin. A surface of the isolation layer is lower than top surfaces of the first fin, the second fin and the third fin. Moreover, the method includes forming a first epitaxial layer on the first fin, forming a second epitaxial layer on the second fin, and forming a third epitaxial layer on the third fin. Two sides of the third epitaxial layer are in contact with the first epitaxial layer and the second epitaxial layer, respectively. Further, the method includes forming a conductive structure on the first epitaxial layer, the second epitaxial layer, and the third epitaxial layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
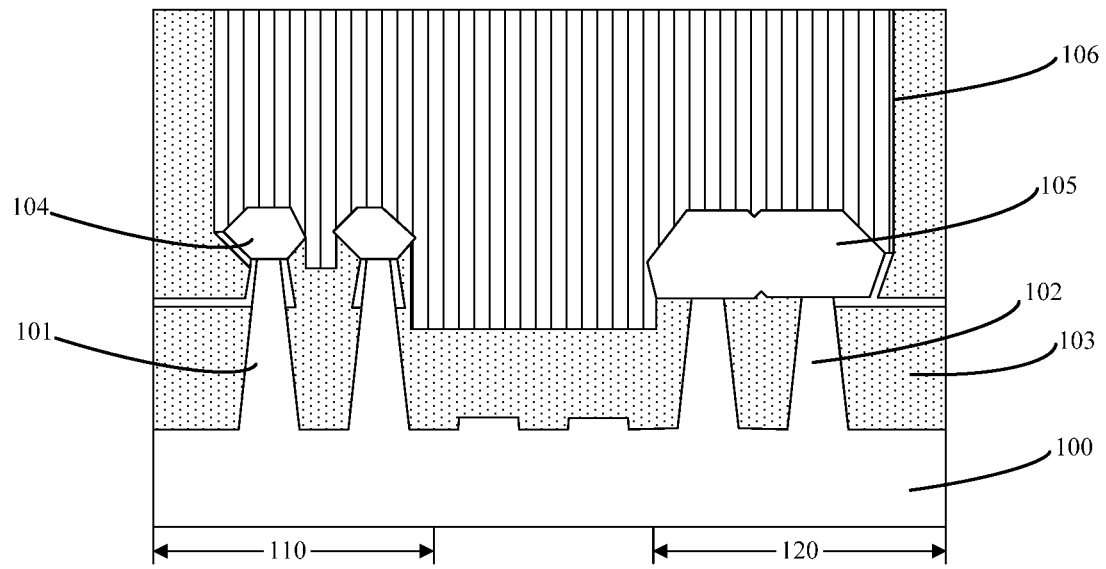
FIG. 1 illustrates a cross-sectional view of a semiconductor structure.

Referring to FIG. 1, the semiconductor structure includes a substrate 100. The substrate 100 includes a first region 110 and a second region 120. A first fin 101 is formed on the first region 110 of the substrate, and a second fin 102 is formed on the second region 120 of the substrate. The semiconductor structure also includes an isolation layer 103 formed on the substrate. The isolation layer 103 is also formed on a portion of the sidewall surface of the first fin 101 and a portion of the sidewall surface of the second fin 102. A surface of the isolation layer 103 is lower than top surfaces of the first fin 101 and the second fin 102. Moreover, the semiconductor structure includes a first epitaxial layer 104 formed in the first fin 101 and a second epitaxial layer 105 formed in the second fin 102. Further, the semiconductor structure includes a conductive structure 106 formed on the surfaces of the first epitaxial layer 104, the second epitaxial layer 105, and the isolation layer 103.

In the semiconductor structure, the first region 110 is not adjacent to the second region 120. The surface of the first epitaxial layer 104 has a height different from the surface of the isolation layer 103, and the surface of the second epitaxial layer 105 has a height different from the surface of the isolation layer 103. Therefore, parasitic capacitance is generated in the conductive structure 106 formed on the surfaces of the first epitaxial layer 104 and the isolation layer 103, and in the conductive structure 106 formed on the surfaces of the second epitaxial layer 105 and the isolation layer 103, which increases the power consumption of the semiconductor device.

Moreover, when etching the first and second epitaxial layers to form the conductive structure 106, the edge of the first epitaxial layer 104 and the edge of the second epitaxial layer 105 are greatly damaged, such that the volume of the first epitaxial layer 104 decreases, and the volume of the second epitaxial layer 105 decreases. At the same time, a contact area between the conductive structure 106 and the first epitaxial layer 104 decreases, and a contact area between the conductive structure 106 and the second epitaxial layer 105 decreases. Therefore, a contact resistance between the conductive structure 106 and the first epitaxial layer 104 increases, and a contact resistance between the conductive structure 106 and the second epitaxial layer 105 increases. Thus, a current of the circuit of the formed semiconductor device decreases, which does not facilitate the improvement of the electrical performance of the semiconductor device.

The present disclosure provides a semiconductor structure and a method for forming the semiconductor structure. A third epitaxial layer may be formed in a fin between a first region and a second region. The third epitaxial layer may be in contact with a first epitaxial layer and a second epitaxial layer, and a conductive structure may be formed on the first epitaxial layer, the second epitaxial layer and the third epitaxial layer. Thus, the problem that parasitic capacitance is generated in the conductive structure formed on the surfaces of the epitaxial layer and the isolation layer may be solved, and the contact area between the conductive structure and the epitaxial layer may increase to reduce the contact resistance, thereby improving the performance of the semiconductor structure.

Figure 12:
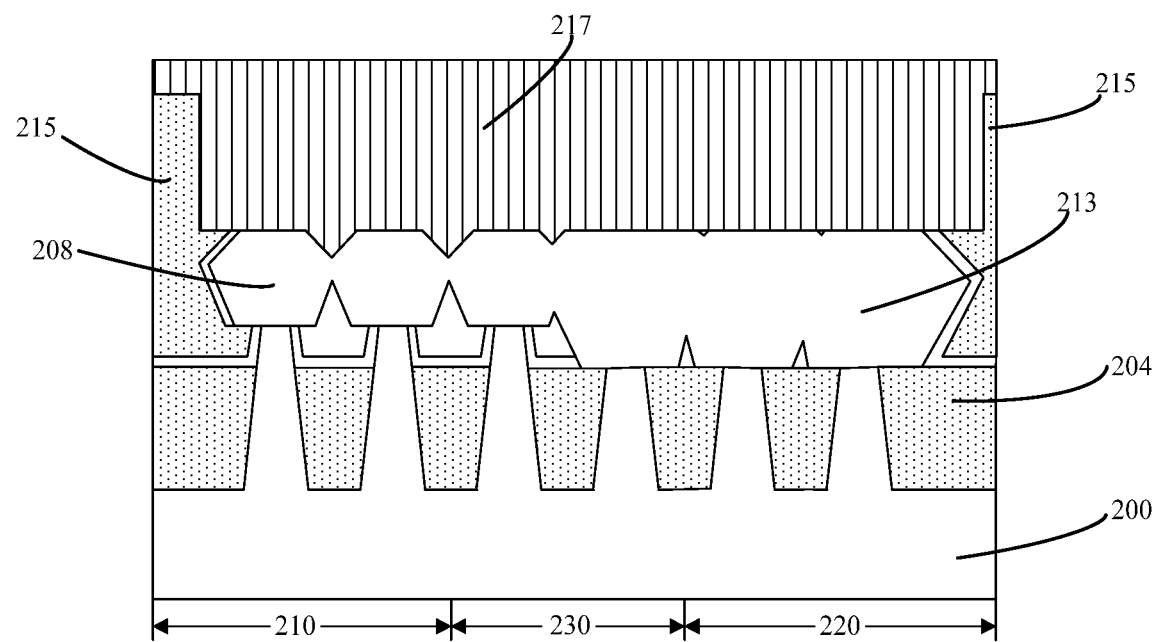
Figure 13:
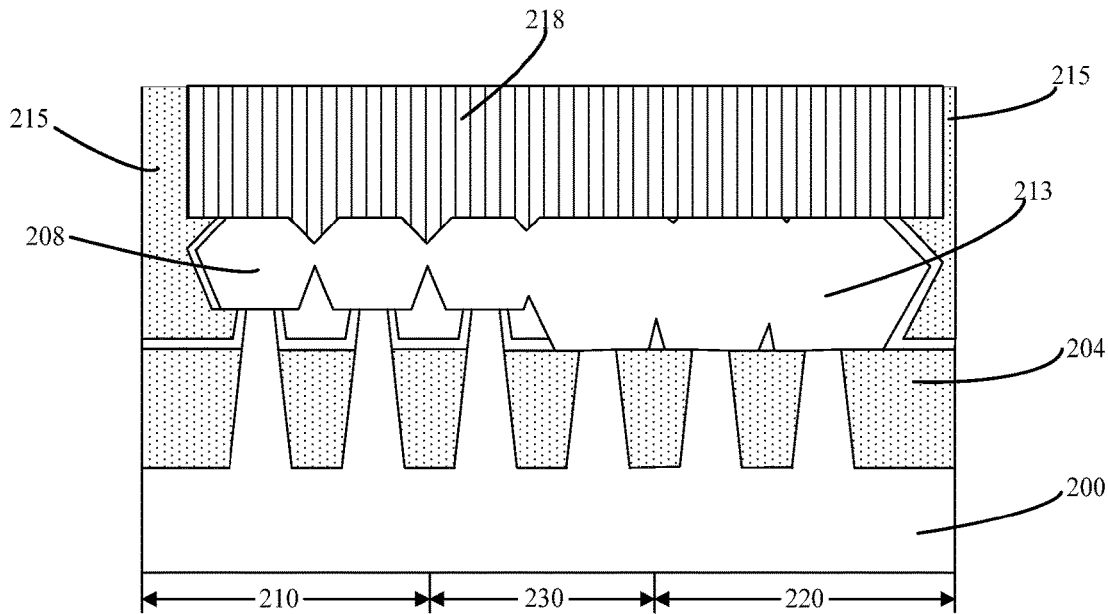
Figure 14:
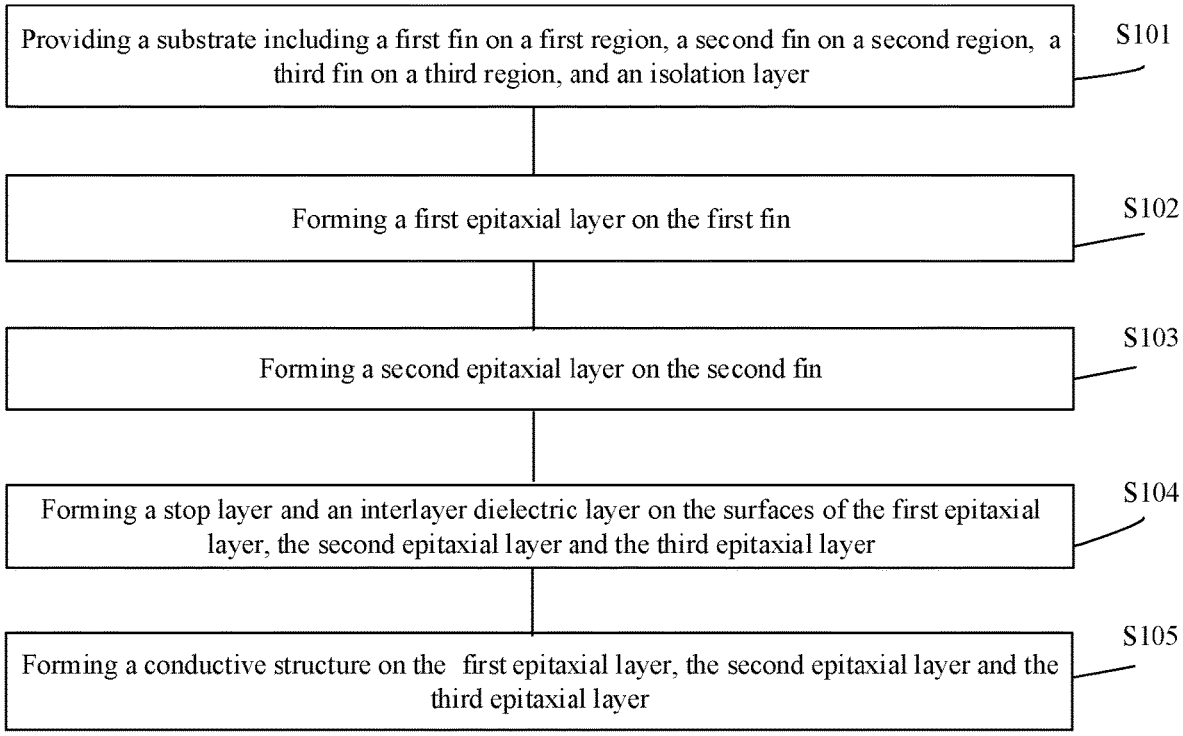
FIG. 14 illustrates an exemplary method for forming a semiconductor structure consistent with various disclosed embodiments of the present disclosure.

FIG. 14 illustrates an exemplary method for forming a semiconductor structure consistent with various disclosed embodiments of the present disclosure, and FIGS. 2-13 illustrate semiconductor structures corresponding to certain stages of the exemplary fabrication method.

Figure 2:
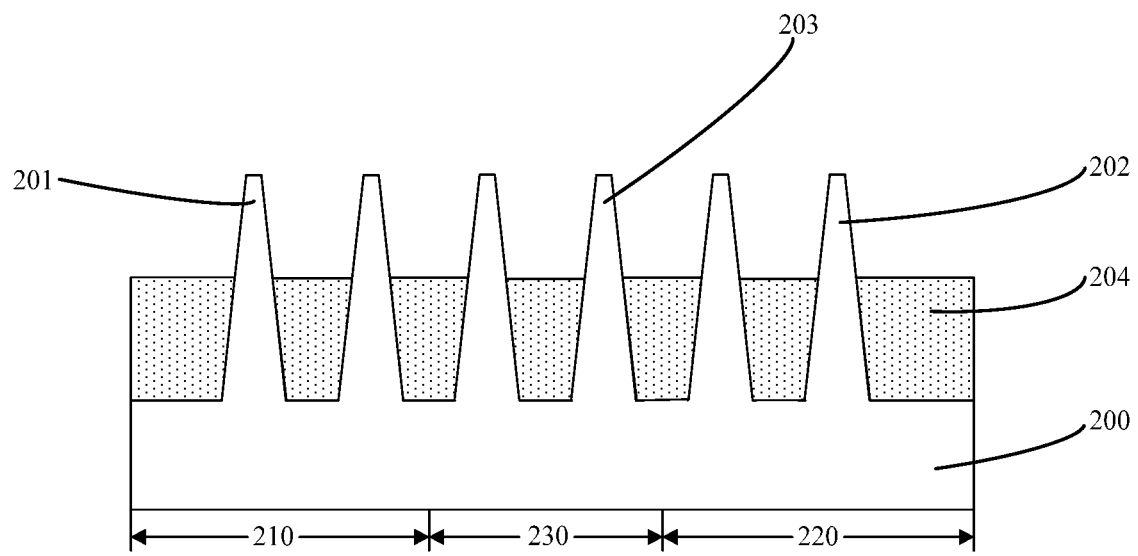
FIGS. 2-13 illustrate semiconductor structures corresponding to certain stages for forming an exemplary semiconductor structure consistent with various disclosed embodiments of the present disclosure.

As shown in FIG. 14, at the beginning of the fabrication method, a substrate with certain structures may be provided (S101). FIG. 2 illustrates a corresponding semiconductor structure.

Referring to FIG. 2, a substrate 200 may be provided. The substrate 200 may include a first region 210, a second region 220, and a third region 230. A first fin 201 may be formed on the first region 210, a second fin 202 may be formed on the second region 220, and a third fin 203 may be formed on the third region 230. An isolation layer 204 may be formed on the substrate 200 and sidewall surfaces of the first fin 201, the second fin 202, and the third fin 203. A dummy gate structure (not illustrated) may be formed on the first fin 201, the second fin 202, and the third fin 203.

The first region 210 and the second region 220 may be disposed on both sides of the third region 230, and the third region 230 may be adjacent to the first region 210 and the second region 220. The first fin 201, the second fin 202, and the third fin 203 may be parallel to each other. A surface of the isolation layer 204 may be lower than surfaces of the first fin, the second fin and the third fin. The dummy gate structure may be across a length portion of the first fin, a length portion of the second fin, and a length portion of the third fin, and may cover a portion of each of the top surface and the sidewall of the first fin, a portion of each of the top surface and the sidewall of the second fin, and a portion of each of the top surface and the sidewall of the third fin.

In one embodiment, the substrate 200 may include a silicon substrate. In another embodiment, the substrate 200 may further include a silicon germanium substrate, a silicon carbide substrate, a silicon on insulator (SOI) substrate, a germanium on insulator (GOI) substrate, a glass substrate, or Group III-V compounds substrates, such as a gallium arsenide (GaAs) substrate, or a gallium nitride (GaN) substrate, etc.

In one embodiment, a quantity of the first fins in the first region 210 may be greater than or equal to one. A quantity of the second fins in the second region 220 may be greater than or equal to one. A quantity of third fins in the third region 230 may be greater than or equal to one.

Figure 3:
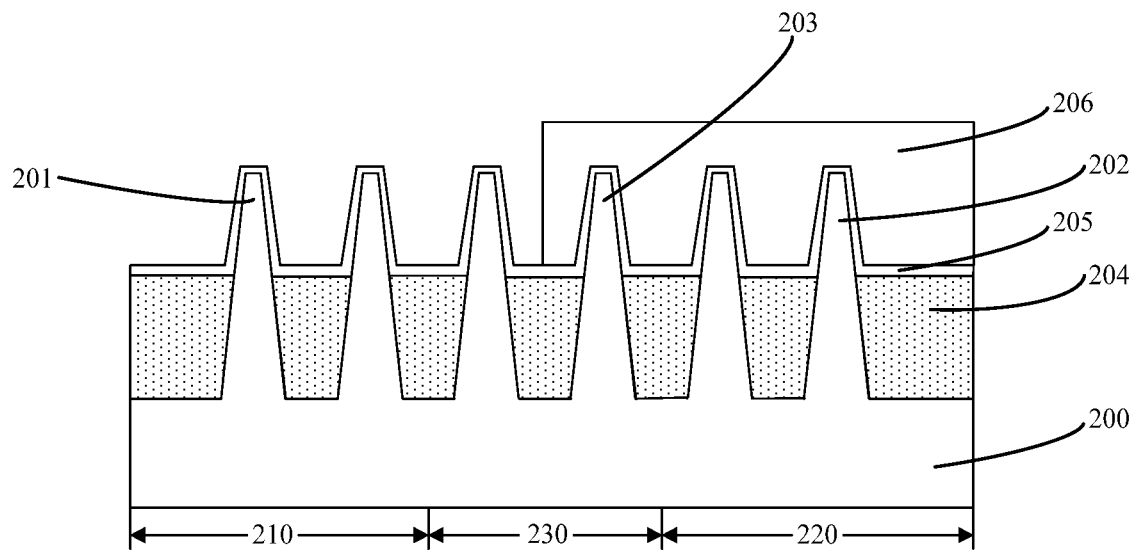
Figure 4:
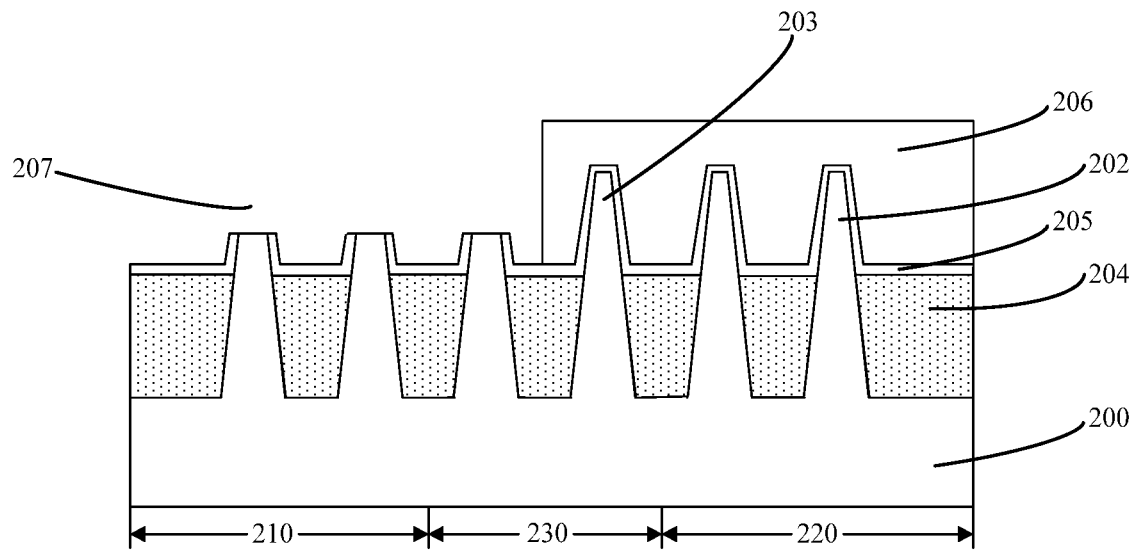
Figure 5:
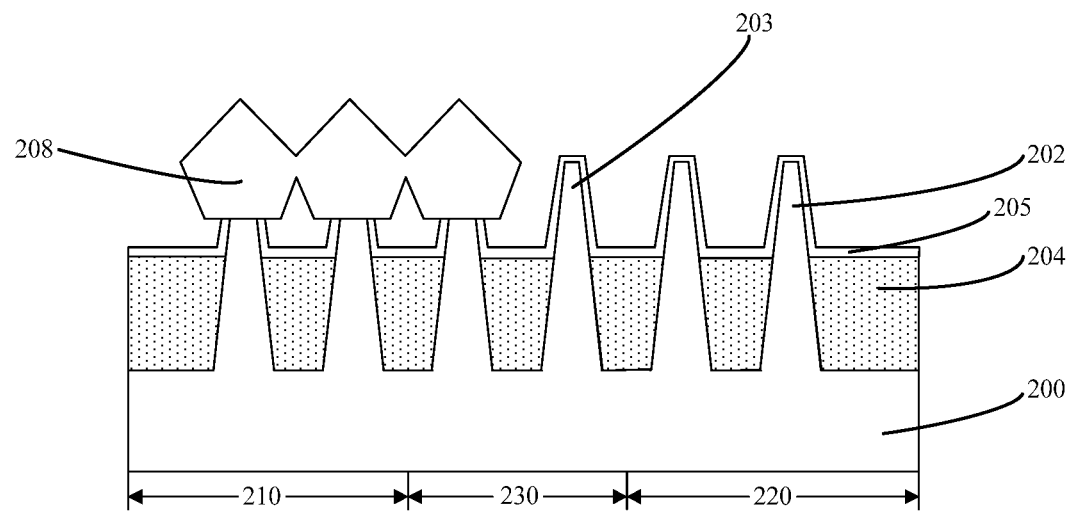

Returning to FIG. 14, after providing the substrate, a first epitaxial layer may be formed (S102). FIGS. 3-5 illustrate corresponding semiconductor structures.

Referring to FIGS. 3-5, a first epitaxial layer may be formed on the first fin 201. The method for forming the first epitaxial layer may include the following. A first mask layer may be formed over the isolation layer 204, the second fin 202, and a second part or entire third fin 203. A first opening may be formed in the first fin 201 using the first mask layer as a mask. A selective epitaxial growth may be performed in the first opening to form the first epitaxial layer.

The first epitaxial layer may be made of a material different from a second epitaxial layer, and a third epitaxial layer may be made of a material including one or more materials of the first epitaxial layer and the second epitaxial layer, which may be dependent on the quantity of the third fins in the third region 230. When the quantity of third fins is greater than or equal to one, a mixed epitaxial layer (the third epitaxial layer) may be formed on the one or more third fins. The mixed epitaxial layer may include a first layer and/or a second layer. For example, the first epitaxial layer may be formed on a selected number of third fins adjacent to the first region as the first layer of the mixed epitaxial layer, and the first layer of the mixed epitaxial layer and the first epitaxial layer may be simultaneously formed; and/or the second epitaxial layer may be formed on another selected number of third fins adjacent to the second region as the second layer of the mixed epitaxial layer, and the second layer of the mixed epitaxial layer and the second epitaxial layer may be simultaneously formed.

In one embodiment, the first epitaxial layer may be made of a material including phosphorus silicon, and the second epitaxial layer may be made of a material including silicon germanium. In another embodiment, the first epitaxial layer may be made of a material including silicon germanium, and the second epitaxial layer may be made of a material including phosphorus silicon.

Referring to FIG. 3, before forming the first mask layer, a first protection layer 205 may be formed on the isolation layer 204, and on sidewalls and surfaces of the first fin 201, the second fin 202, and the third fin 203. A first mask layer 206 may be formed on the first protection layer 205 over each second fin 202 as well as a second part or entire third fin 203, and the first mask layer 206 may expose the first protection layer 205 over each first fin 201 as well as a first part or entire third fin 203.

In one embodiment, a process for forming the first protection layer 205 may include a chemical vapor deposition process or a physical vapor deposition process. The first protection layer 205 may be made of a material including silicon nitride.

In the present disclosure, the first protection layer 205 may be formed on the isolation layer 204 and on the sidewalls and surfaces of the first fin 201, the second fin 202, and the third fin 203. Therefore, when subsequently forming the first epitaxial layer in the first opening formed in each first fin 201 and the first part or entire third fin 203 by a selective epitaxial growth, the second fin 202 and the remaining third fin 203 may be protected to prevent the first epitaxial layer from being formed in the second fin 202 and in the remaining third fin 203.

In one embodiment, the first mask layer 206 may be made of a material including a photoresist.

Referring to FIG. 4, using the first mask layer 206 as a mask, the each first fin 201 and the first part or entire third fin 203 may be etched to form a first opening 207 in the each first fin 201 and the first part or entire third fin 203. After forming the first opening 207, the first mask layer 206 may be removed.

Referring to FIG. 5, using the first protection layer 205 as a mask, a selective epitaxial growth may be performed in the first opening 207 to form the first epitaxial layer 208. In one embodiment, the first epitaxial layer 208 may be made of a material including phosphorus silicon. The epitaxial growth method of the first epitaxial layer may include introducing a phosphorus-containing reaction gas into the first opening 207; and forming a phosphorus-silicon layer by growth in the first opening 207.

Parameters of the epitaxial growth process of the first epitaxial layer may include the following. The phosphorus-containing reaction gas may include $SiH_4$, $PH_3$, and $AsH_3$, a gas pressure may be in a range of approximately 1 Torr-100 Torr, and a temperature may be in a range of approximately 500° C.-800° C. In another embodiment, the reaction gas may be a carbon-source gas.

In one embodiment, a volume of the first epitaxial layer 208 formed in the first opening 207 may increase by increasing the gas reaction period of time until the first epitaxial layers 208 between adjacent first fins are in contact with each other.

Figure 6:
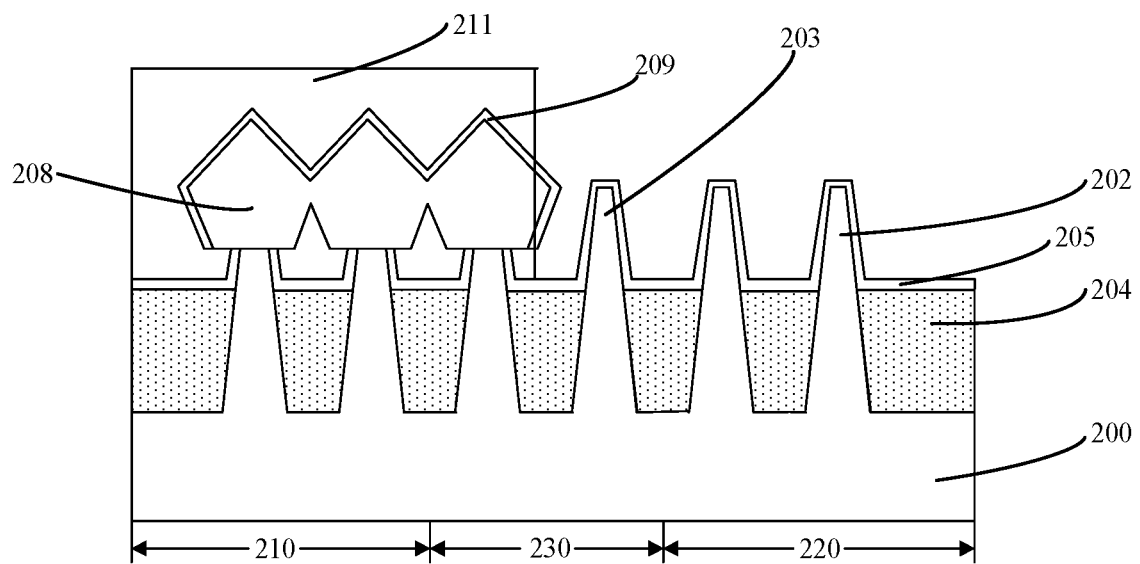
Figure 7:
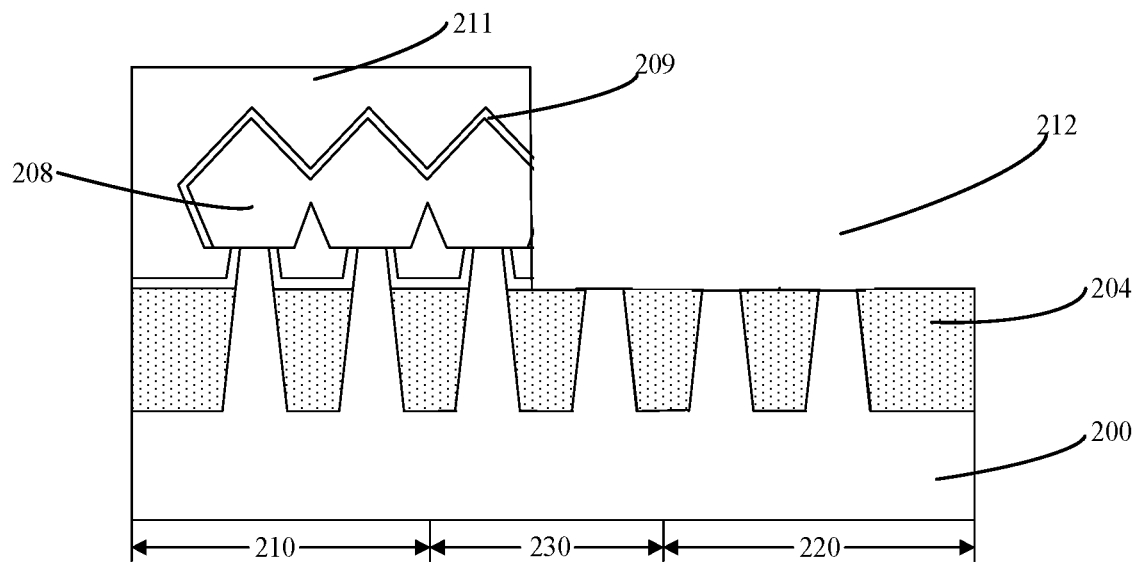
Figure 8:
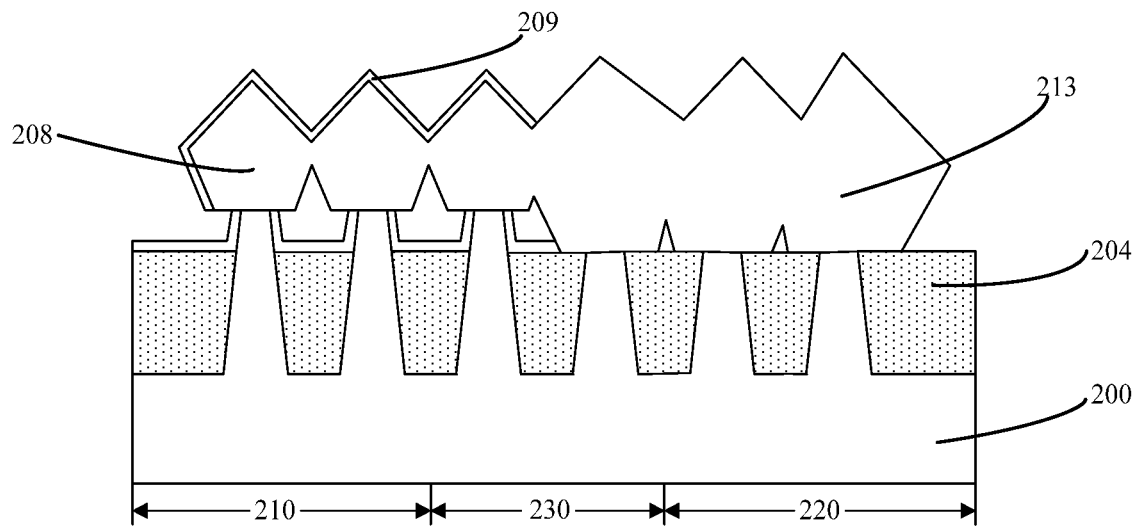

Returning to FIG. 14, after forming the first epitaxial layer, a second epitaxial layer may be formed (S103). FIGS. 6-8 illustrate corresponding semiconductor structures.

Referring to FIGS. 6-8, a second epitaxial layer may be formed on the second fin 202. The method for forming the second epitaxial layer may include the following. A second mask layer may be formed over the isolation layer 204, the first fin 201, and the first part or entire third fin 203. A second opening may be formed in the second fin 202 by using the second mask layer as a mask. A selective epitaxial growth may be performed in the second opening to form the second epitaxial layer.

Referring to FIG. 6, before forming the second mask layer, a second protection layer 209 may be formed over the isolation layer 204, over the sidewall and surface of the first fin 201, over the sidewall and surface of the first part or entire third fin 203, and on the first epitaxial layer 208. A second mask layer 211 may be formed on the second protection layer 209, and the second mask layer 211 may expose the first protection layer 205 over each second fin 202 as well as the second part or entire third fin 203, and a portion of the second protection layer 209.

In one embodiment, a process for forming the second protection layer 209 may include a chemical vapor deposition process or a physical vapor deposition process. The second protection layer 209 may be made of a material including silicon nitride.

In the present disclosure, the second protection layer 209 may be formed over the isolation layer 204, over the sidewall and surface of the first fin 201, over the sidewall and surface of the first part or entire third fin 203, and on the first epitaxial layer 208. Therefore, when subsequently forming the second epitaxial layer in the second opening formed in each second fin 202 and the second part or entire third fin 203 by a selective epitaxial growth, the first fin 201 and the first part or entire third fin 203 may be protected to prevent the second epitaxial layer from being formed on the first fin 201, on the first part or entire third fin 203, and on the first epitaxial layer 208.

In one embodiment, the second mask layer 211 may be made of a material including a photoresist.

Referring to FIG. 7, using the second mask layer 211 as a mask, the second fin 202 and the second part or entire third fin 203 may be etched to form a second opening 212 in the second fin 202 and the second part or entire third fin 203. In one embodiment, the exposed first protection layer 205 and the exposed second protection layer 209 may also be etched in the process of etching the second fin 202 and the second part or entire third fin 203. After forming the second opening 212, the second mask layer 211 may be removed.

Referring to FIG. 8, using the second protection layer 209 as a mask, a selective epitaxial growth may be performed in the second opening 212 to form the second epitaxial layer 213. In one embodiment, the second epitaxial layer 213 may be made of a material including silicon germanium. The epitaxial growth method of the second epitaxial layer may include introducing a germanium-containing reaction gas into the second opening 212; and forming a silicon germanium layer by growth in the second opening 212.

Parameters of the epitaxial growth process of the second epitaxial layer may include the following. The germanium-containing reaction gas may include $SiH_4$, $GeH_4$, and $B_2H_6$, a gas pressure may be in a range of approximately 1 Torr-100 Torr, and a temperature may be in a range of approximately 500° C.-800° C.

In the present disclosure, a volume of the second epitaxial layer 213 formed in the second opening 212 may increase by increasing the gas reaction period of time until the second epitaxial layers 213 between adjacent second fins are in contact with each other. At the same time, the second epitaxial layer formed in the second part of the third fin may be in contact with the first epitaxial layer formed in the first part of the third fin.

In one embodiment, the second opening 212 may be larger than the first opening 207, and the second epitaxial layer 213 grown in the second opening 212 may have a volume larger than the first epitaxial layer 208 grown in the first opening 207. Therefore, the first epitaxial layer may be made of phosphorous silicon, and the first region may be used to form an NMOS transistor. The epitaxial layer made of phosphorous silicon may increase the tensile stress on a channel of the NMOS transistor, thereby increasing the mobility of carriers on both sides of the gate of the NMOS transistor. Too large volume of the epitaxial layer made of phosphorous silicon may cause too large parasitic capacitance between the gate and the source-drain, and may not effectively increase the tensile stress, and, thus, the first opening 207 may be substantially small.

The second epitaxial layer may be made of silicon germanium, and the second region may be used to form a PMOS transistor. The epitaxial layer made of silicon germanium may increase the compressive stress on a channel of the PMOS transistor, thereby increasing the mobility of carriers on both sides of the gate of the PMOS transistor. The larger the volume of the epitaxial layer made of silicon germanium, the better the compressive stress effect on the channel of the transistor, and, thus, the second opening 212 may be substantially large.

Referring to FIG. 8, a third epitaxial layer may be formed on the third fin 203. Two sides of the third epitaxial layer may be in contact with the first epitaxial layer on the first fin and the second epitaxial layer on the second fin, respectively.

When forming the first epitaxial layer 208 on the first fin 201, the first epitaxial layer 208 may be simultaneously formed on the first part or entire third fin 203. When forming the second epitaxial layer 213 on the second fin 202, the second epitaxial layer 213 may be simultaneously formed on the second part or entire third fin 203. The third epitaxial layer may include a portion of the first epitaxial layer 208 formed on the first part or entire third fin 203 and a portion of the second epitaxial layer 213 formed on the second part or entire third fin 203. Thus, the third epitaxial layer may be in contact with the first epitaxial layer 208 on the first fin and the second epitaxial layer 213 on the second fin, respectively.

In one embodiment, the third fin 203 may act as a carrier while forming the third epitaxial layer on the third fin. The third epitaxial layer may be used to connect the first epitaxial layer 208 on the first fin and the second epitaxial layer 213 on the second fin, and the conductive structure may be subsequently formed on the surfaces of the first epitaxial layer 208, the second epitaxial layer 213 and the third epitaxial layer. The problems that a gap is formed between the first epitaxial layer 208 and the second epitaxial layer 213, a portion of the conductive structure is formed on the isolation layer 204, the surface of the first epitaxial layer has a height different from the surface of the isolation layer 204, the surface of the second epitaxial layer has a height different from the surface of the isolation layer 204, and the parasitic capacitance caused by the height difference is generated may be avoided.

Figure 9:
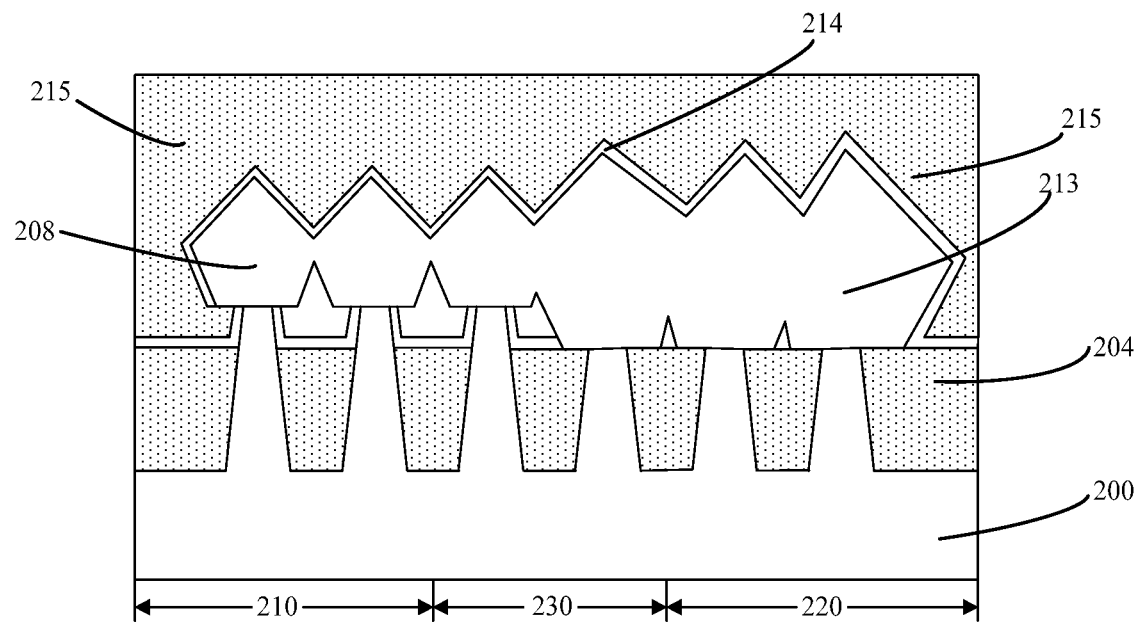

Returning to FIG. 14, after forming the second epitaxial layer, a stop layer and an interlayer dielectric layer may be formed (S104). FIG. 9 illustrates a corresponding semiconductor structure.

Referring to FIG. 9, after forming the first epitaxial layer 208, the second epitaxial layer 213 and the third epitaxial layer, a stop layer 214 may be formed on the surfaces of the first epitaxial layer 208, the second epitaxial layer 213 and the third epitaxial layer. In one embodiment, the second protection layer may not be illustrated in FIG. 9, and the stop layer 214 may be formed on the second protection layer. In one embodiment, the stop layer 214 may be made of a material including silicon nitride, and the process for forming the stop layer 214 may include a chemical vapor deposition process.

An interlayer dielectric layer 215 may be formed on the stop layer. In one embodiment, the interlayer dielectric layer 215 may be made of a material including one or more of silicon oxide, and silicon oxynitride. The process for forming the interlayer dielectric layer 215 may include a chemical vapor deposition process or a spin coating process. After forming the interlayer dielectric layer 215, a planarization treatment may be performed on the interlayer dielectric layer 215 until a top surface of the dummy gate structure is exposed. The planarization treatment may be a chemical mechanical polishing process.

The interlayer dielectric layer 215 may function as an insulator. The interlayer dielectric layer 215 may not only electrically isolate the device and the interconnection metal layer, but also physically isolate the device from impurity sources, e.g., movable particles, etc. In one embodiment, the interlayer dielectric layer may be any other suitable dielectric layer having an insulating function.

After forming the interlayer dielectric layer 215, the dummy gate structure (not illustrated) may be removed to form a gate opening (not illustrated) in the interlayer dielectric layer. A gate structure (not illustrated) may be formed in the gate opening.

Returning to FIG. 14, after forming the stop layer and the interlayer dielectric layer, a conductive structure may be formed (S105). FIGS. 10-13 illustrate corresponding semiconductor structures.

Referring to FIGS. 10-13, a conductive structure may be formed on the first epitaxial layer 208, the second epitaxial layer 213, and the third epitaxial layer. The method for forming the conductive structure may include the following. After forming the gate structure, a conductive trench may be formed in the interlayer dielectric layer 215 to expose the stop layer over the first epitaxial layer, the second epitaxial layer and the third epitaxial layer. After forming the conductive trench in the interlayer dielectric layer, the stop layer exposed at the bottom of the conductive trench may be removed. After removing the stop layer exposed at the bottom of the conductive trench, the conductive structure may be formed in the conductive trench.

In certain embodiments, the first epitaxial layer, the second epitaxial layer and the third epitaxial layer that are in contact with each other may be directly used as the conductive structure, which may replace the conductive structure formed in the subsequent process, and may simplify the process for forming the semiconductor structure.

Figure 10:
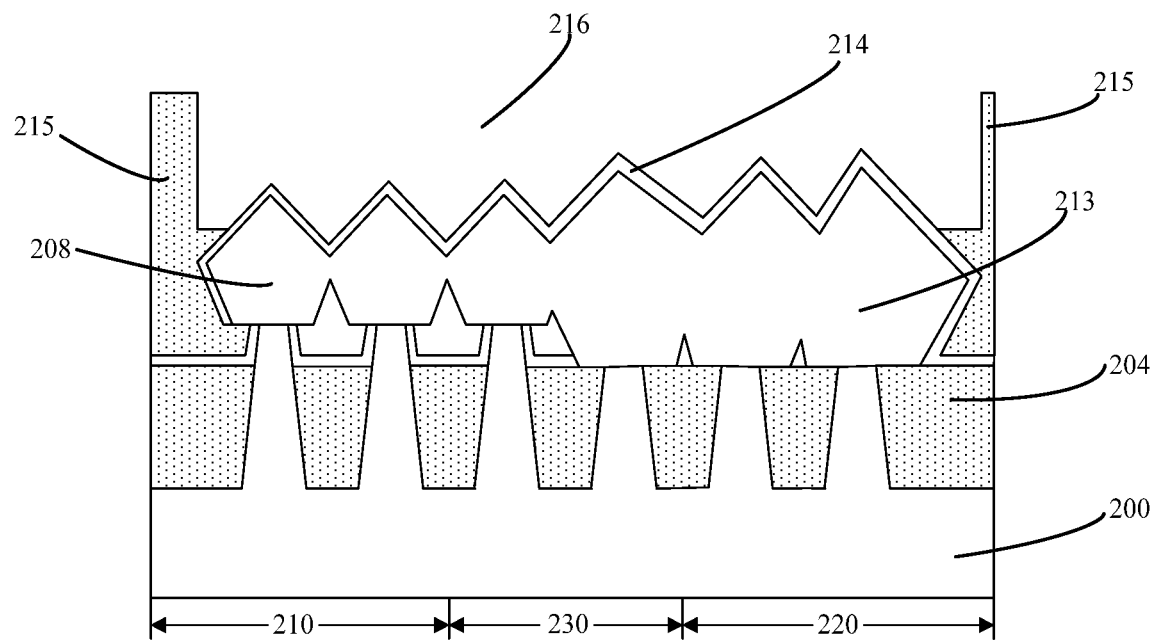

Referring to FIG. 10, a conductive trench 216 may be formed in the interlayer dielectric layer 215. The method for forming the conductive trench 216 may include the following. A patterned mask layer (not illustrated) may be formed on the interlayer dielectric layer 215, and the patterned mask layer may expose the stop layer 214 over the first epitaxial layer, the second epitaxial layer and the third epitaxial layer. The interlayer dielectric layer 215 may be etched using the patterned mask layer as a mask until the stop layer 214 is exposed to form the conductive trench 216.

The interlayer dielectric layer 215 may be made of a material different from the stop layer 214, and, thus, the interlayer dielectric layer 215 may have an etching rate different from the stop layer 214. Therefore, a selective etching may be performed on the interlayer dielectric layer 215, and the stop layer 214 may stop the etching. The conductive trench 216 may be used to subsequently form the conductive structure on the surfaces of the first epitaxial layer, the second epitaxial layer, and the third epitaxial layer.

Figure 11:
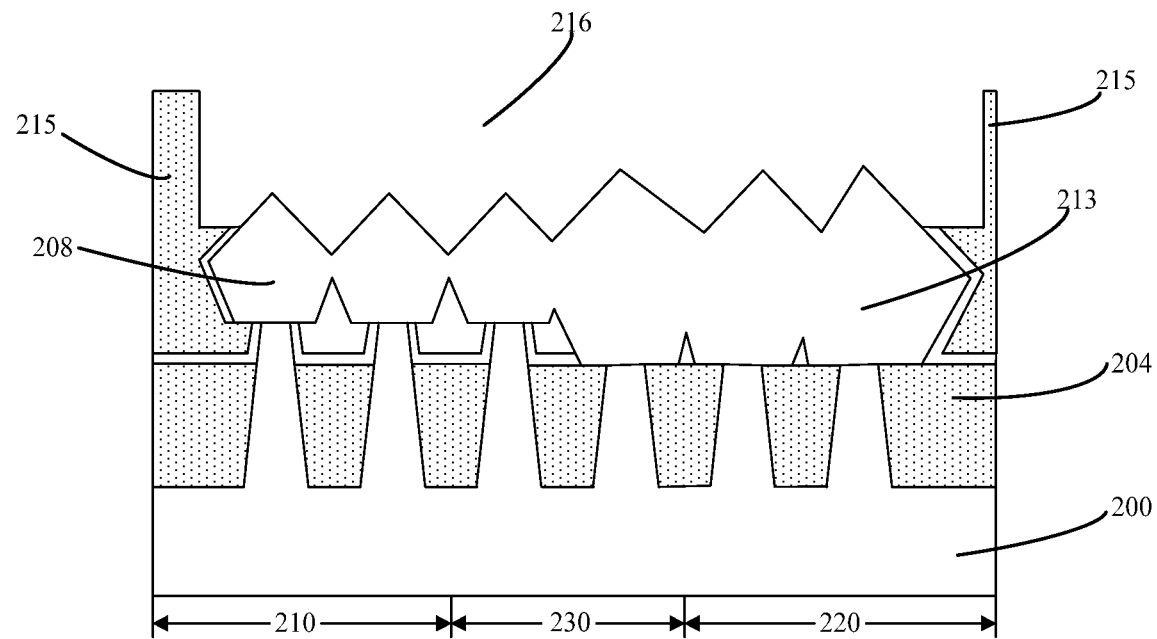

Referring to FIG. 11, after forming the conductive trench 216, the stop layer 214 exposed at the bottom of the conductive trench 216 may be removed to expose the surfaces of the first epitaxial layer, the second epitaxial layer, and the third epitaxial layer.

In one embodiment, the etching process for removing the stop layer 214 may include a dry etching process. After removing the stop layer 214, the conductive structure may be formed in the conductive trench 216.

The method for forming the conductive structure may include the following. A metal silicide layer may be formed on the surfaces of the first epitaxial layer, the second epitaxial layer and the third epitaxial layer exposed by the conductive trench. A conductive layer may be formed on the interlayer dielectric layer and in the conductive trench. The conductive layer may be planarized until the interlayer dielectric layer is exposed to form the conductive structure.

Referring to FIG. 11, the metal silicide layer (not illustrated) may be formed on the surfaces of the first epitaxial layer, the second epitaxial layer and the third epitaxial layer exposed by the conductive trench 216. The method for forming the metal silicide layer may include the following. A metal material layer may be formed on the sidewall and bottom surfaces of the conductive trench 216. The metal material layer may be annealed to form the metal silicide. After performing the annealing process, the remaining metal material layer may be removed.

In one embodiment, the metal silicide may include a titanium silicon compound. The metal silicide may reduce the contact resistance between the subsequently formed conductive structure and the epitaxial layer.

Referring to FIG. 12, a conductive layer 217 may be formed on the interlayer dielectric layer 215 and in the conductive trench 216. In one embodiment, the process for forming the conductive layer 217 may include a chemical vapor deposition process. The conductive layer 217 may be made of a material including one or more of copper, tungsten, and aluminum.

Referring to FIG. 13, the conductive layer 217 may be planarized until the interlayer dielectric layer 215 is exposed to form the conductive structure 218. In one embodiment, the process for planarizing the conductive layer 217 may include a chemical mechanical polishing process.

Accordingly, the present disclosure also provides a semiconductor structure. The semiconductor structure may be formed by the above disclosed methods. Referring to FIG. 13, the semiconductor structure may include a substrate 200. The substrate 200 may include a first region 210, a second region 220, and a third region 230. The first region 210 and the second region 220 may be disposed on both sides of the third region 230, and two sides of the third region 230 may be adjacent to the first region 210 and the second region 220, respectively.

A first fin may be formed on the first region 210, a second fin may be formed on the second region 220, and a third fin may be formed on the third region 230. The first fin 201, the second fin 202, and the third fin 203 may be parallel to each other. An isolation layer 204 may be formed on the substrate. The isolation layer 204 may also be formed on a portion of sidewall surface of the first fin, a portion of sidewall surface of the second fin, and a portion of sidewall surface the third fin. A surface of the isolation layer 204 may be lower than top surfaces of the first fin, the second fin and the third fin.

The semiconductor structure may also include a first epitaxial layer 208 formed on the first fin, a second epitaxial layer 213 formed on the second fin, and a third epitaxial layer formed on the third fin. Two sides of the third epitaxial layer may be in contact with the first epitaxial layer and the second epitaxial layer, respectively. Further, the semiconductor structure may include a conductive structure 218 formed on the first epitaxial layer, the second epitaxial layer, and the third epitaxial layer.

In the disclosed semiconductor structure, the first epitaxial layer on the first fin and the second epitaxial layer on the second fin may be connected together by the third epitaxial layer, and the conductive structure may be subsequently formed on the first epitaxial layer, the second epitaxial layer and the third epitaxial layer. Therefore, an issue that a portion of the conductive structure is formed on the isolation layer between the first epitaxial layer and the second epitaxial layer may be avoided. The problems that the conductive structure on the surface of the first epitaxial layer has a height different from the conductive structure on the surface of the isolation layer, the conductive structure on the surface of the second epitaxial layer has a height different from the conductive structure on the surface of the isolation layer, and the parasitic capacitance due to the height difference is generated may be solved. The damages on the first epitaxial layer and the second epitaxial layer during the process for forming the conductive structure may be reduced. The contact area between the conductive structure and the first epitaxial layer, the second epitaxial layer and the third epitaxial layer may increase to reduce the contact resistance, thereby improving the performance of the semiconductor structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A semiconductor structure, comprising:
   a substrate, wherein the substrate includes a first region, a second region, and a third region, the first region and the second region are disposed on both sides of the third region, and two sides of the third region are adjacent to the first region and the second region, respectively;
   a first fin formed on the first region, a second fin formed on the second region, and a third fin formed on the third region, wherein the first fin, the second fin, and the third fin are parallel to each other;
   an isolation layer formed on the substrate, a portion of sidewall surface of the first fin, a portion of sidewall surface of the second fin, and a portion of sidewall surface of the third fin, wherein a surface of the isolation layer is lower than top surfaces of the first fin, the second fin and the third fin;
   a first epitaxial layer formed on the first fin;
   a second epitaxial layer formed on the second fin, wherein a volume of the second epitaxial layer is larger than a volume of the first epitaxial layer;
   a third epitaxial layer formed on the third fin, wherein two sides of the third epitaxial layer are in contact with the first epitaxial layer and the second epitaxial layer, respectively; and
   a conductive structure formed on the first epitaxial layer, the second epitaxial layer, and the third epitaxial layer.

2. The semiconductor structure according to claim 1, wherein:
   a quantity of first fins in the first region is greater than or equal to one;
   a quantity of second fins in the second region is greater than or equal to one; and a quantity of third fins in the third region is greater than or equal to one.

3. The semiconductor structure according to claim 1, wherein:
the third epitaxial layer and the first epitaxial layer are made of a same material; or
the third epitaxial layer and the second epitaxial layer are made of a same material.

4. The semiconductor structure according to claim 1, wherein:
the third epitaxial layer includes a first layer and a second layer;
the first layer is in contact with the second layer and the first epitaxial layer, and the first layer and first epitaxial layer are made of a same material; and
the second layer is in contact with the first layer and the second epitaxial layer, and the second layer and the second epitaxial layer are made of a same material.

5. The semiconductor structure according to claim 1, wherein:
the first epitaxial layer is made of a material including phosphorus silicon; and
the second epitaxial layer is made of a material including silicon germanium.

6. The semiconductor structure according to claim 1, wherein:
the conductive structure is made of a material including one or more of copper, tungsten, and aluminum.

7. The semiconductor structure according to claim 1, further including:
a metal silicide layer on the surfaces of the first epitaxial layer, the second epitaxial layer and the third epitaxial layer, wherein the conductive structure is formed on the metal silicide layer.

8. A method for forming a semiconductor structure, comprising:
providing a substrate including a first region, a second region, and a third region, wherein the first region and the second region are disposed on both sides of the third region, and two sides of the third region are adjacent to the first region and the second region, respectively;
forming a first fin on the first region, a second fin on the second region, and a third fin on the third region, respectively, wherein the first fin, the second fin, and the third fin are parallel to each other;
forming an isolation layer on the substrate, a portion of sidewall surface of the first fin, a portion of sidewall surface of the second fin, and a portion of sidewall surface of the third fin, wherein a surface of the isolation layer is lower than top surfaces of the first fin, the second fin and the third fin;
forming a first epitaxial layer on the first fin;
forming a second epitaxial layer on the second fin, wherein a volume of the second epitaxial layer is larger than a volume of the first epitaxial layer;
forming a third epitaxial layer on the third fin, wherein two sides of the third epitaxial layer are in contact with the first epitaxial layer and the second epitaxial layer, respectively; and
forming a conductive structure on the first epitaxial layer, the second epitaxial layer, and the third epitaxial layer.

9. The method according to claim 8, wherein:
the first epitaxial layer is made of a material including phosphorus silicon; and
the second epitaxial layer is made of a material including silicon germanium.

10. The method according to claim 8, wherein forming the first epitaxial layer includes:
forming a first mask layer over the isolation layer, the second fin, and a second part or entire third fin;
forming a first opening in the first fin using the first mask layer as a mask; and
performing a selective epitaxial growth in the first opening to form the first epitaxial layer.

11. The method according to claim 8, wherein forming the second epitaxial layer includes:
forming a second mask layer over the isolation layer, the first fin, and a first part or entire third fin;
forming a second opening in the second fin using the second mask layer as a mask; and
performing a selective epitaxial growth in the second opening to form the second epitaxial layer.

12. The method according to claim 8, wherein:
the third epitaxial layer and the first epitaxial layer are simultaneously formed; or,
the third epitaxial layer and the second epitaxial layer are simultaneously formed; or,
a portion of the third epitaxial layer and the first epitaxial layer are simultaneously formed, and the other portion of the third epitaxial layer and the second epitaxial layer are simultaneously formed.

13. A method for forming a semiconductor structure, comprising:
providing a substrate including a first region, a second region, and a third region, wherein the first region and the second region are disposed on both sides of the third region, and two sides of the third region are adjacent to the first region and the second region, respectively;
forming a first fin on the first region, a second fin on the second region, and a third fin on the third region, respectively, wherein the first fin, the second fin, and the third fin are parallel to each other;
forming an isolation layer on the substrate, a portion of sidewall surface of the first fin, a portion of sidewall surface of the second fin, and a portion of sidewall surface of the third fin, wherein a surface of the isolation layer is lower than top surfaces of the first fin, the second fin and the third fin;
forming a first epitaxial layer on the first fin;
forming a second epitaxial layer on the second fin;
forming a third epitaxial layer on the third fin, wherein two sides of the third epitaxial layer are in contact with the first epitaxial layer and the second epitaxial layer, respectively;
forming a stop layer on surfaces of the first epitaxial layer, the second epitaxial layer and the third epitaxial layer;
forming an interlayer dielectric layer on the stop layer;
forming a conductive trench in the interlayer dielectric layer over the first epitaxial layer, the second epitaxial layer and the third epitaxial layer;
after forming the conductive trench in the interlayer dielectric layer, removing the stop layer exposed at a bottom of the conductive trench;
forming a conductive structure in the conductive trench on the first epitaxial layer, the second epitaxial layer, and the third epitaxial layer.

14. The method according to claim 13, forming the conductive structure includes:
forming a conductive layer on the interlayer dielectric layer and in the conductive trench, and
planarizing the conductive layer until the interlayer dielectric layer is exposed to form the conductive structure.

15. The method according to claim 13, wherein:
the stop layer is made of a material including silicon nitride, and
the interlayer dielectric layer is made of a material including silicon oxide.

16. The method according to claim 13, further including:
before forming the interlayer dielectric layer, forming a dummy gate structure over the first fin, the second fin and the third fin; and
after forming the interlayer dielectric layer, removing the dummy gate structure to form a gate opening in the interlayer dielectric layer, and forming a gate structure in the gate opening.

17. The method according to claim 13, wherein forming the conductive trench includes:
forming a patterned mask layer on the interlayer dielectric layer, and
etching the interlayer dielectric layer using the patterned mask layer as a mask until the stop layer is exposed to form the conductive trench.

18. The method according to claim 13, before forming the conductive structure, further including:
forming a metal silicide layer on the surfaces of the first epitaxial layer, the second epitaxial layer and the third epitaxial layer exposed by the conductive trench, wherein the conductive structure is formed on the metal silicide layer.

19. The method according to claim 18, wherein:
the metal silicide layer is made of a material including titanium silicon compound, and
the conductive structure is made of a material including one or more of copper, tungsten, and aluminum.

20. The semiconductor structure according to claim 4, wherein:
a volume of the second layer is larger than a volume of the first layer.

* * * * *